(12) United States Patent
Takahashi et al.

(10) Patent No.: US 8,569,824 B2
(45) Date of Patent: Oct. 29, 2013

(54) SEMICONDUCTOR DEVICE AND FABRICATION METHOD FOR THE SAME

(75) Inventors: Nobuyoshi Takahashi, Toyama (JP); Ichirou Matsuo, Kyoto (JP)

(73) Assignee: Panasonic Corporation, Osaka (JP)

( * ) Notice: Subject to any disclaimer, the term of this patent is extended or adjusted under 35 U.S.C. 154(b) by 689 days.

(21) Appl. No.: 12/360,488

(22) Filed: Jan. 27, 2009

(65) Prior Publication Data

US 2009/0189214 A1    Jul. 30, 2009

(30) Foreign Application Priority Data

Jan. 30, 2008   (JP) ................................. 2008-018659

(51) Int. Cl.
*H01L 29/792*      (2006.01)
(52) U.S. Cl.
USPC .................................... 257/324; 257/E29.309
(58) Field of Classification Search
USPC .......................................... 257/324, E29.309
See application file for complete search history.

(56) References Cited

U.S. PATENT DOCUMENTS

| | | | |
|---|---|---|---|
| 4,597,060 A * | 6/1986 | Mitchell et al. .......... | 365/185.16 |
| 4,728,619 A | 3/1988 | Pfiester et al. | |
| 5,972,783 A | 10/1999 | Arai et al. | |
| 6,172,393 B1 | 1/2001 | Kanamori et al. | |
| 6,300,664 B1 | 10/2001 | Kuroi et al. | |
| 6,388,295 B1 * | 5/2002 | Yamashita et al. ............. | 257/371 |
| 6,940,152 B2 | 9/2005 | Arai | |
| 7,184,291 B2 | 2/2007 | Bollu et al. | |
| 2002/0052081 A1 | 5/2002 | Eitan | |
| 2005/0127449 A1 | 6/2005 | Momiyama | |
| 2005/0277273 A1 * | 12/2005 | Sasaki et al. .................. | 438/479 |
| 2006/0038241 A1 * | 2/2006 | Matsuo .......... | 257/401 |
| 2006/0220088 A1 | 10/2006 | Ueno | |
| 2006/0273374 A1 * | 12/2006 | Kobayashi et al. ........... | 257/315 |
| 2007/0007590 A1 * | 1/2007 | Kinoshita et al. ............. | 257/336 |
| 2007/0232039 A1 * | 10/2007 | Kubo et al. .................... | 438/527 |
| 2008/0150007 A1 * | 6/2008 | Brennan et al. ............... | 257/324 |

FOREIGN PATENT DOCUMENTS

| | | |
|---|---|---|
| EP | 1 073 120 A2 | 1/2001 |
| JP | 7-176743 | 7/1995 |
| JP | 11-312795 | 11/1999 |
| JP | 2001-077220 | 3/2001 |
| JP | 2006-0286720 A | 10/2006 |
| JP | 2007-5699 A | 1/2007 |
| JP | 2008-16711 A | 1/2008 |
| WO | WO 03/071606 A1 | 8/2003 |

* cited by examiner

*Primary Examiner* — Matthew Reames
(74) *Attorney, Agent, or Firm* — McDermott Will & Emery LLP

(57) ABSTRACT

The semiconductor device includes: a plurality of bit lines formed in stripes in a semiconductor substrate of a first conductivity type, each of the bit lines being a diffusion layer of an impurity of a second conductivity type; a plurality of gate insulation films formed on regions of the semiconductor substrate between the bit lines; a plurality of word lines formed on the semiconductor substrate via the gate insulating films, the word lines extending in a direction intersecting with the bit lines; and a plurality of bit line isolation diffusion layers formed in regions of the semiconductor substrate between the word lines, each of the bit line isolation diffusion layers being a diffusion layer of an impurity of the first conductivity type. The bit line isolation diffusion layer includes a diffusion suppressor for suppressing diffusion of an impurity.

11 Claims, 15 Drawing Sheets

SEMICONDUCTOR DEVICE AND FABRICATION METHOD FOR THE SAME

CROSS-REFERENCE TO RELATED APPLICATIONS

This application claims priority under 35 U.S.C. §119 on Patent Application No. 2008-018659 filed in Japan on Jan. 30, 2008, the entire contents of which are hereby incorporated by reference.

BACKGROUND OF THE INVENTION

The present invention relates to a semiconductor device and a fabrication method for the same, and more particularly to a semiconductor device having bit lines and word lines intersecting with the bit lines and a fabrication method for such a semiconductor device.

The structure of a semiconductor device having bit lines and word lines orthogonal to the bit lines is outstanding for the capability of reducing the memory cell area, and is essential for miniaturization of the semiconductor device. To attain desired properties with such a structure, the impurity profile must be made proper.

For formation of a semiconductor device having bit lines and word lines intersecting with the bit lines, a method as follows, for example, is disclosed (see Japanese Laid-Open Patent Publication No. 2001-077220, for example).

First, on a semiconductor substrate of a first conductivity type, formed is an ONO film composed of a lower oxide film, a nitride film and an upper oxide film sequentially placed one upon another. Part of the ONO film is then removed in stripes using a mask pattern. Subsequently, an impurity of a second conductivity type is implanted in the portions of the semiconductor substrate of the first conductivity type from which the ONO film has been removed, to form bit lines. After removal of the mask pattern, insulating films are formed on the bit lines. A conductive material is then deposited, and the deposited conductive material is selectively removed, to form word lines in a direction orthogonal to the direction in which the bit lines extend.

SUMMARY OF THE INVENTION

However, the conventional semiconductor device described above has a problem that as miniaturization of the semiconductor device proceeds, the influence of the narrow channel effect and the short channel effect becomes evident.

The narrow channel effect is a phenomenon that with the channel being narrowed, an impurity for isolating bit lines enters the channel region resulting in increase in threshold voltage.

For isolation of adjacent bit lines from each other, normally adopted is a method in which after formation of word lines, an impurity of the first conductivity type is implanted in regions between the word lines. This method of isolating adjacent bit lines using PN junction, which is outstanding for the capability of reducing the memory cell area, is useful for memory cells for which miniaturization is required. However, with miniaturization being pushed forward, the impurity of the first conductivity type implanted in the inter-word-line regions diffuses even to under the word lines, increasing the influence of the narrow channel effect.

The short channel effect is a phenomenon that the threshold voltage decreases with increase in punch-through current and the like, which is caused by increasing the impurity density of the bit lines, for example.

For miniaturization of a semiconductor device, the pitch of bit line linings must be reduced to reduce the cell area. For this reason, it is essential to increase the impurity density of bit lines to reduce the resistance of the bit lines. In general, an impurity of the order of $1 \times 10^{15}/cm^2$ is implanted for formation of bit lines. Implantation of a high-density impurity like this however increases the influence of the short channel effect.

As described above, for further miniaturization of a semiconductor device having bit lines and word lines orthogonal to the bit lines, proper control of the impurity profile in inter-word-line regions or in bit lines and the like is necessary.

The present disclosure provides a semiconductor device permitting proper control of the impurity profile in inter-word-line regions or in bit lines and the like.

Specifically the first semiconductor device of the present disclosure includes: a plurality of bit lines formed in stripes in a semiconductor substrate of a first conductivity type, each of the bit lines being a diffusion layer of an impurity of a second conductivity type; a plurality of gate insulation films formed on regions of the semiconductor substrate between the plurality of bit lines; a plurality of word lines formed on the semiconductor substrate via the gate insulating films, the word lines extending in a direction intersecting with the plurality of bit lines; and a plurality of bit line isolation diffusion layers formed in regions of the semiconductor substrate between the plurality of word lines, each of the bit line isolation diffusion layers being a diffusion layer of an impurity of the first conductivity type and including a diffusion suppressor for suppressing diffusion of an impurity.

In the first semiconductor device, diffusion of an impurity of the first conductivity type for isolating the bit lines can be suppressed. Hence, the narrow channel effect can be suppressed while the bit line isolation characteristic is sufficiently secured. As a result, a semiconductor device having bit lines and word lines orthogonal to the bit lines can be further miniaturized.

The second semiconductor device of the present disclosure includes: a plurality of bit lines formed in stripes in a semiconductor substrate of a first conductivity type, each of the bit lines being a diffusion layer of an impurity of a second conductivity type; a plurality of gate insulation films formed in regions of the semiconductor substrate between the plurality of bit lines; and a plurality of word lines formed on the semiconductor substrate via the gate insulating films, the word lines extending in a direction intersecting with the plurality of bit lines, wherein each of the bit lines includes a diffusion suppressor for suppressing diffusion of an impurity.

In the second semiconductor device, diffusion of an impurity can be suppressed even when the dose of the impurity in the bit lines is high. Hence, the resistance of the bit lines can be made low while the narrow channel effect is suppressed. As a result, a semiconductor device having bit lines and word lines orthogonal to the bit lines can be further miniaturized.

The first fabrication method for a semiconductor device of the present disclosure includes the steps of: (a) forming a plurality of first insulating films in stripes by forming a first insulating film formation film on a semiconductor substrate of a first conductivity type and then selectively removing the formed first insulating film formation film; (b) forming a plurality of bit lines by introducing an impurity of a second conductivity type in regions of the semiconductor substrate between the plurality of first insulating films; (c) forming bit line overlying insulating films on the bit lines; (d) forming a first conductive film on the entire surface of the semiconductor substrate after the step (c); (e) forming a plurality of word lines extending in a direction intersecting with the plurality of bit lines by selectively removing the first conductive film; and (f) forming a plurality of bit line isolation diffusion layers by first introducing a diffusion suppressor for suppressing diffusion of an impurity and then introducing an impurity of the first conductivity type in regions of the semiconductor substrate between the plurality of word lines.

In the first fabrication method for a semiconductor device, diffusion of an impurity in the bit line isolation diffusion layers can be suppressed. Hence, the narrow channel effect can be suppressed while the bit line isolation characteristic is sufficiently secured.

As a result, a semiconductor device having bit lines and word lines orthogonal to the bit lines can be further miniaturized.

The second fabrication method for a semiconductor device of the present disclosure includes the steps of: (a) forming a plurality of first insulating films in stripes by forming a first insulating film formation film on a semiconductor substrate of a first conductivity type and then selectively removing the formed first insulating film formation film; (b) forming a plurality of bit lines by first introducing a diffusion suppressor for suppressing diffusion of an impurity and then introducing an impurity of a second conductivity type in regions of the semiconductor substrate between the plurality of first insulating films; (c) forming bit line overlying insulating films on the bit lines; and (d) after the step (c), forming a plurality of word lines extending in a direction intersecting with the plurality of bit lines by forming a first conductive film on the entire surface of the semiconductor substrate and then selectively removing the formed first conductive film.

In the second fabrication method for a semiconductor device, diffusion of an impurity in the bit lines can be suppressed. Hence, the resistance of the bit lines can be made low while the narrow channel effect is suppressed. As a result, a semiconductor device having bit lines and word lines orthogonal to the bit lines can be further miniaturized.

The third fabrication method for a semiconductor substrate of the present disclosure includes the steps of: (a) forming a plurality of multilayer films in stripes each having a first insulating film, a first conductive film and a mask pattern formed one upon another by forming a first insulating film formation film, a first conductive film formation film and the mask pattern sequentially on a semiconductor substrate of a first conductivity type and then selectively removing the first insulating film formation film and the first conductive film formation film using the mask pattern; (b) forming a plurality of bit lines by first introducing a diffusion suppressor for suppressing diffusion of an impurity and then introducing an impurity of a second conductivity type in regions of the semiconductor substrate between the plurality of multilayer films; (c) after the step (b), forming bit line overlying insulating films so as to fill regions between the plurality of multilayer films; and (d) after the step (c), forming a plurality of word lines extending in a direction intersecting with the plurality of bit lines, each of the word lines having a plurality of lower conductive films and an upper conductive film for electrically connecting the plurality of lower conductive films with each other, by forming a second conductive film on the entire surface of the semiconductor substrate and then selectively removing the formed second conductive film and the first conductive films.

In the third fabrication method for a semiconductor device, a diffusion suppressor can be implanted in the first insulating films. This permits, not only suppression of diffusion of an impurity in the bit lines, but also improvement in the film quality and trap characteristics of the first insulating films.

BRIEF DESCRIPTION OF THE DRAWINGS

FIGS. 1A and 1B are cross-sectional views of a semiconductor device of Embodiment 1 of the present invention, in which FIG. 1A shows a section in the gate length direction and FIG. 1B in the gate width direction.

FIGS. 2A and 2B are cross-sectional views showing a process step of a fabrication method for the semiconductor device of Embodiment 1 of the present invention, in which FIG. 2A shows a section in the gate length direction and FIG. 2B in the gate width direction.

FIGS. 3A and 3B are cross-sectional views showing a process step of the fabrication method for the semiconductor device of Embodiment 1, in which FIG. 3A shows a section in the gate length direction and FIG. 3B in the gate width direction.

FIGS. 4A and 4B are cross-sectional views showing a process step of the fabrication method for the semiconductor device of Embodiment 1, in which FIG. 4A shows a section in the gate length direction and FIG. 4B in the gate width direction.

FIGS. 5A and 5B are cross-sectional views showing a process step of the fabrication method for the semiconductor device of Embodiment 1, in which FIG. 5A shows a section in the gate length direction and FIG. 5B in the gate width direction.

FIGS. 6A and 6B are cross-sectional views of a semiconductor device of Embodiment 2 of the present invention, in which FIG. 6A shows a section in the gate length direction and FIG. 6B in the gate width direction.

FIGS. 7A and 7B are cross-sectional views showing a process step of a fabrication method for the semiconductor device of Embodiment 2 of the present invention, in which FIG. 7A shows a section in the gate length direction and FIG. 7B in the gate width direction.

FIGS. 8A and 8B are cross-sectional views showing a process step of the fabrication method for the semiconductor device of Embodiment 2, in which FIG. 8A shows a section in the gate length direction and FIG. 8B in the gate width direction.

FIGS. 9A and 9B are cross-sectional views showing a process step of the fabrication method for the semiconductor device of Embodiment 2, in which FIG. 9A shows a section in the gate length direction and FIG. 9B in the gate width direction.

FIGS. 10A and 10B are cross-sectional views showing a process step of the fabrication method for the semiconductor device of Embodiment 2, in which FIG. 10A shows a section in the gate length direction and FIG. 10B in the gate width direction.

FIGS. 11A and 11B are cross-sectional views of a semiconductor device of Embodiment 3 of the present invention, in which FIG. 11A shows a section in the gate length direction and FIG. 11B in the gate width direction.

FIGS. 12A and 12B are cross-sectional views showing a process step of a fabrication method for the semiconductor device of Embodiment 3 of the present invention, in which FIG. 12A shows a section in the gate length direction and FIG. 12B in the gate width direction.

FIGS. 13A and 13B are cross-sectional views showing a process step of the fabrication method for the semiconductor device of Embodiment 3, in which FIG. 13A shows a section in the gate length direction and FIG. 13B in the gate width direction.

FIGS. 14A and 14B are cross-sectional views showing a process step of the fabrication method for the semiconductor device of Embodiment 3, in which FIG. 14A shows a section in the gate length direction and FIG. 14B in the gate width direction.

FIGS. 15A and 15B are cross-sectional views showing a process step of the is fabrication method for the semiconductor device of Embodiment 3, in which FIG. 15A shows a section in the gate length direction and FIG. 15B in the gate width direction.

DESCRIPTION OF THE PREFERRED EMBODIMENTS

Embodiment 1

Figure 1A:
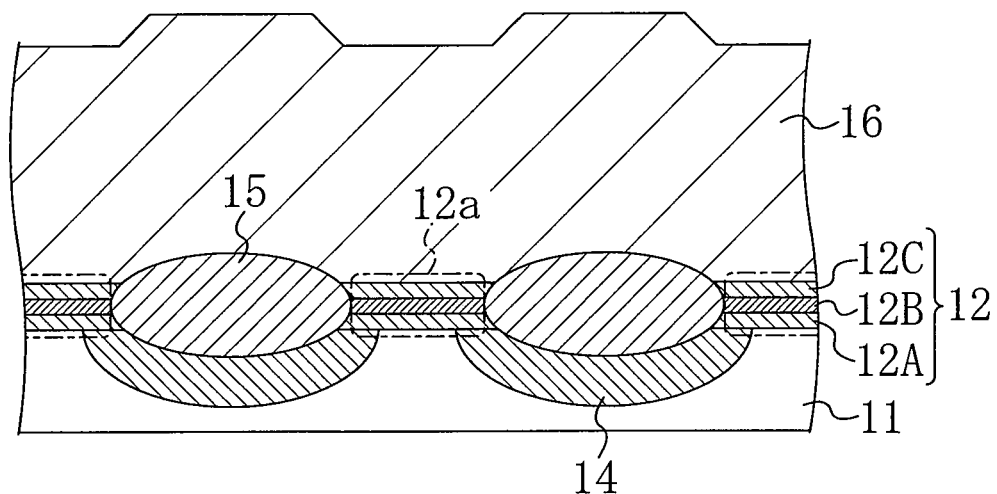
Figure 1B:
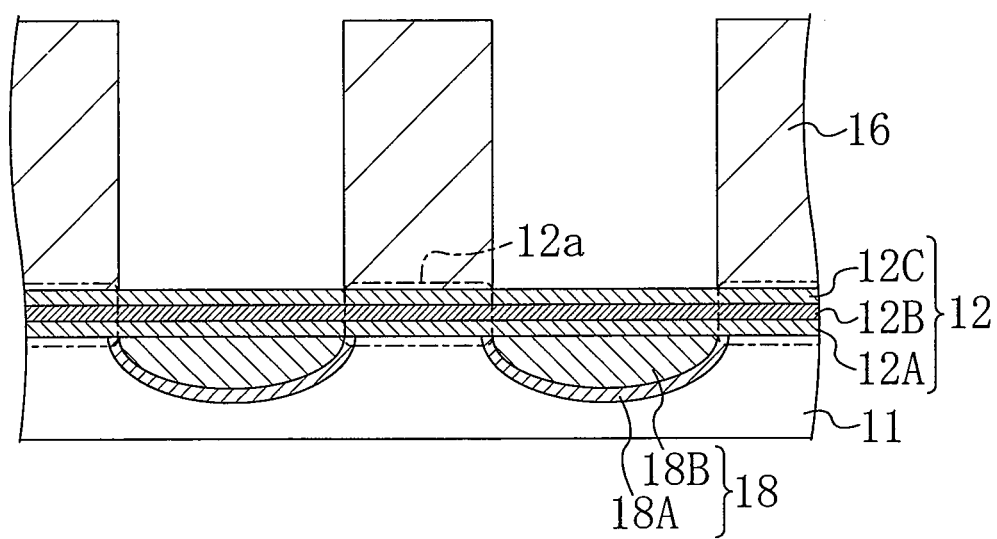
Figure 2A:
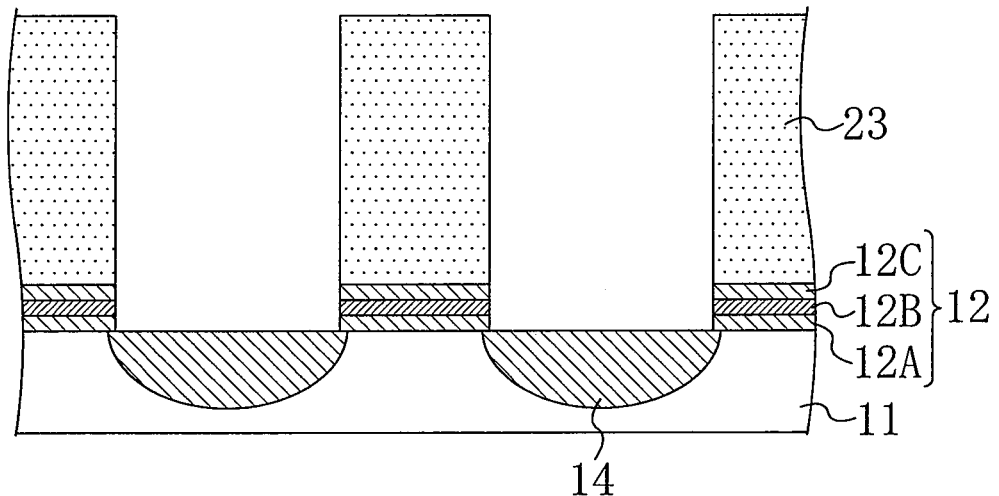
Figure 2B:
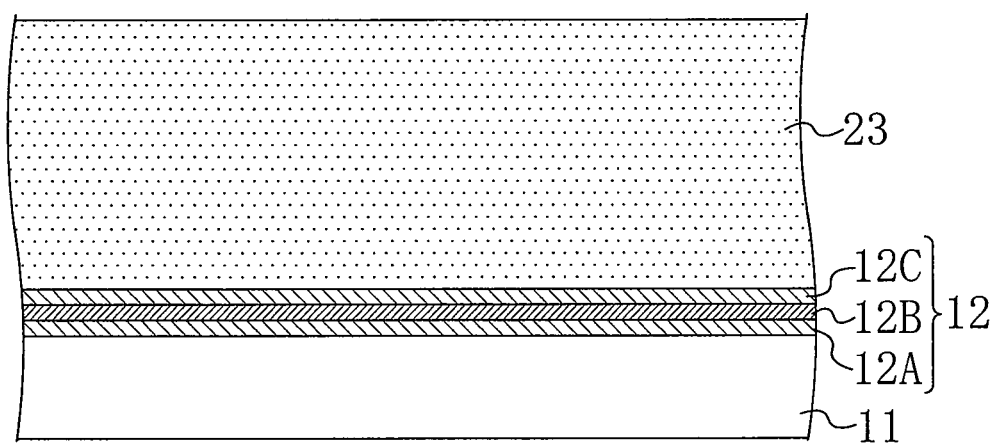

Embodiment 1 will be described with reference to the relevant drawings. FIGS. 1A and 1B show cross-sectional configurations of a semiconductor device of Embodiment 1 in the gate length direction and the gate width direction, respectively.

As shown in FIGS. 1A and 1B, bit lines 14 extending in a first direction (gate width direction) are formed in a semiconductor substrate 11 of a first conductivity type. Word lines 16 extending in a second direction (gate length direction) intersecting with the first direction are formed on the semiconductor substrate 11. Each bit line 14 is a diffusion layer of an impurity of a second conductivity type. The first and second directions are preferably orthogonal to each other.

First insulating films 12 extending in the first direction are formed on regions of the semiconductor substrate 11 between the adjacent bit lines 14. Each first insulating film 12 is an ONO film having a lower oxide film 12A, a nitride film 12B and an upper oxide film 12C sequentially deposited one upon another. Portions of the first insulating films 12 located under the word lines serve as gate insulating films 12a.

Bit line overlying insulating films 15 for insulating the bit lines 14 from the word lines 16 are formed on the bit lines 14 in the semiconductor substrate 11.

Bit line isolation diffusion layers 18 are formed in regions of the semiconductor substrate 11 between the adjacent word lines 16. Each bit line isolation diffusion layer 18 includes an impurity 18A of the first conductivity type and a diffusion suppressor 18B.

Hereinafter, a fabrication method for the semiconductor device of this embodiment will be described with reference to the relevant drawings. Note that FIGS. 2A, 3A, 4A and 5A show the section in the gate length direction and FIGS. 2B, 3B, 4B and 5B show the section in the gate width direction. First, as shown FIGS. 2A and 2B, the lower oxide film (lower $SiO_2$ film) 12A, the nitride film (SiN film) 12B and the upper oxide film (upper $SiO_2$ film) 12C are sequentially deposited one upon another on the semiconductor substrate 11, to form the ONO film. A mask pattern 23 is then formed on the ONO film to selectively remove the ONO film, to thereby form the first insulating films 12 extending in stripes in the first direction. Thereafter, an impurity of the second conductivity type is implanted in regions of the semiconductor substrate 11 between the adjacent first insulating films 12, to form the bit lines 14 extending in stripes.

The thicknesses of the lower oxide film 12A, the nitride film 12B and the upper oxide film 12C may be 5 nm, 5 nm and 10 nm, respectively, for example. The mask pattern 23 may be formed with a photoresist and the like. As the impurity of the second conductivity type, arsenic ions ($As^+$) may be used with a dose of about $2\times10^{15}/cm^2$.

Figure 3A:
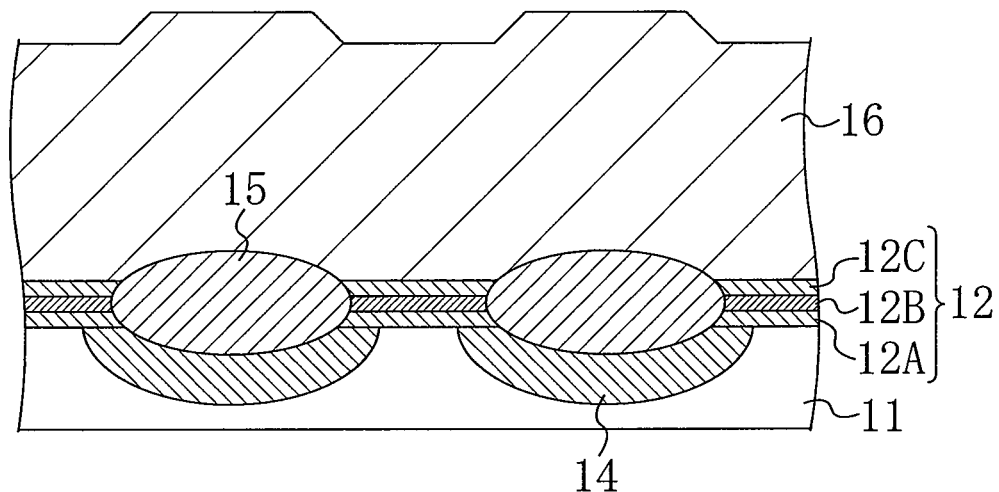
Figure 3B:
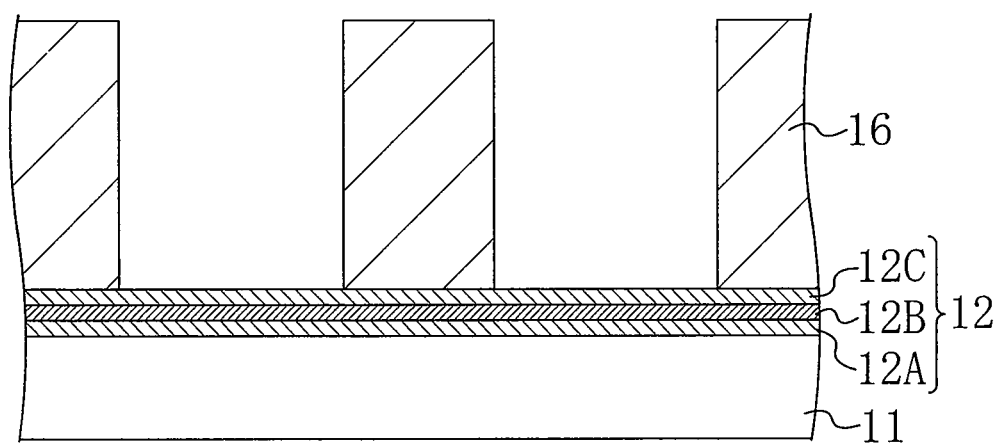

As shown in FIGS. 3A and 3B, after removal of the mask pattern 23, the bit line overlying insulating films 15 are formed on the bit lines 14. Thereafter, a polysilicon film having a thickness of 200 nm, for example, is grown and then implanted with phosphorus ions ($P^+$) with a dose of about $6\times10^{15}/cm^2$. The polysilicon film is then selectively etched by photolithography using a photoresist mask and dry etching, to thereby form the word lines 16 extending in a direction orthogonal to the bit lines 14.

Figure 4A:
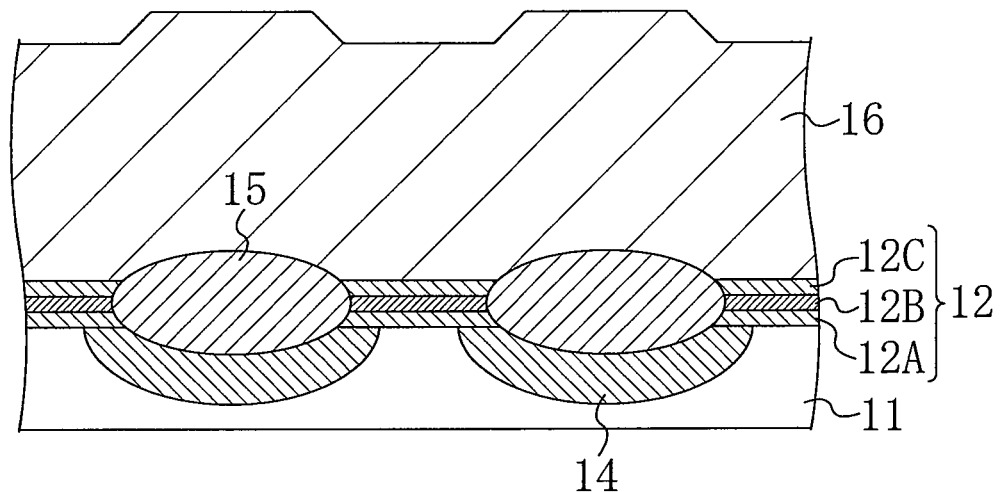
Figure 4B:
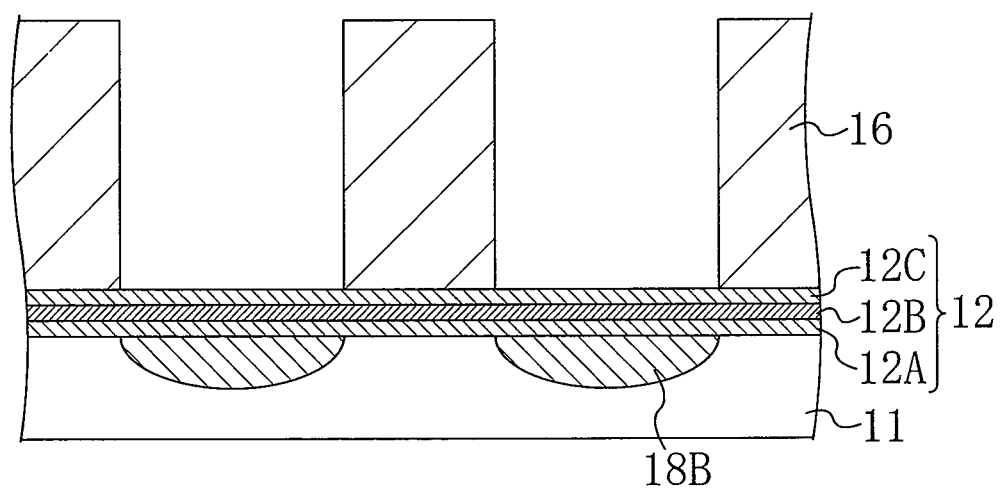

As shown in FIGS. 4A and 4B, the diffusion suppressor 18B is implanted in regions of the semiconductor substrate 11 between the adjacent word lines 16. Note that the diffusion suppressor 18B is also implanted in the word lines 16. As the diffusion suppressor 18B, any one or a combination of any two or more of nitrogen, fluorine, carbon, indium, germanium and silicon may be used. When nitrogen is used as the diffusion suppressor 18B, it is preferred to implant the diffusion suppressor 18B also in regions of the first insulating films 12 in contact with the side edges of the word lines 16. Also, nitrogen implanted in each word line 16 may be made to segregate in the vicinity of the upper oxide film 12C constituting the first insulating film 12 under thermal treatment to follow. With such arrangement, the effect of improving the quality of the ONO films can be obtained. The dose of the diffusion suppressor 18B may be of the order of $1\times10^{15}/cm^2$. The implantation depth (Rp) is preferably made roughly identical to that of the impurity 18A of the first conductivity type to be implanted next. Nitrogen may easily enter the edge portions of the first insulating films 12 by adopting angular implantation with a tilt angle of ion implantation of about 25 degrees.

Figure 5A:
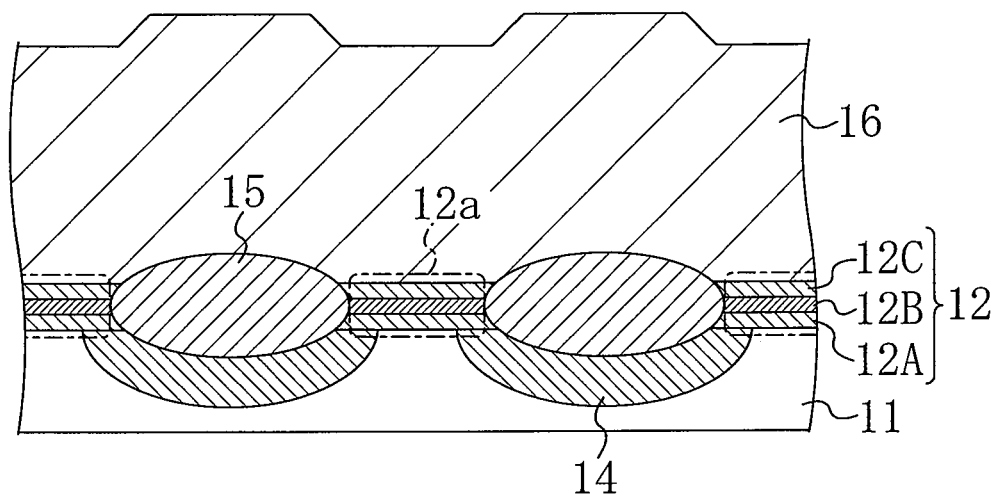
Figure 5B:
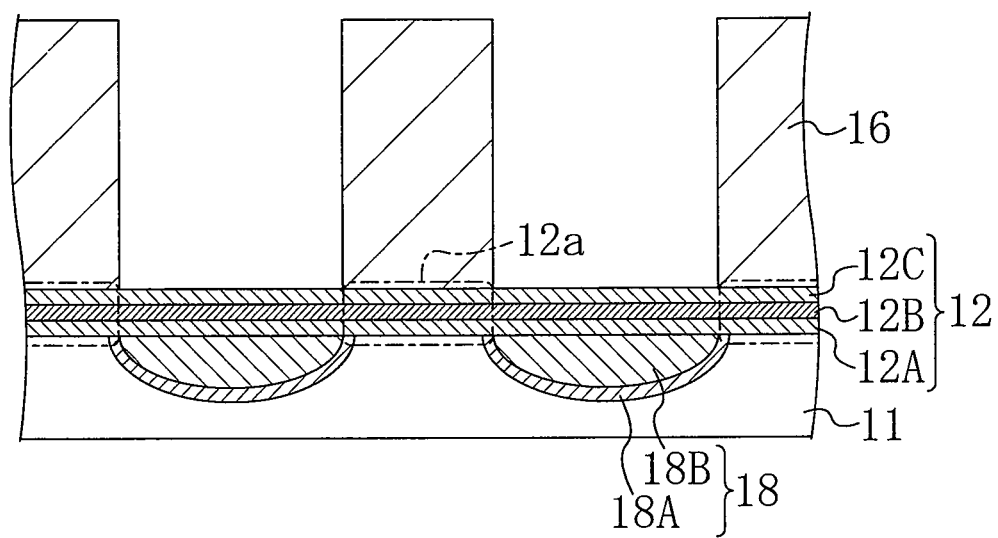

As shown in FIGS. 5A and 5B, the impurity 18A of the first conductivity type is implanted in regions of the semiconductor substrate 11 between the adjacent word lines 11, to thereby form the bit line isolation diffusion layers 18. As the impurity 18A of the first conductivity type, boron ions ($B^+$), for example, may be used with a dose of about $5\times10^{12}/cm^2$. Note that spacer films may be formed on the sidewalls of the word lines 16, and at least the implantation of the diffusion suppressor 18B or the implantation of the impurity 18A of the first conductivity type may be made via the spacer films.

Although not illustrated, contacts may be formed in predetermined regions of the bit lines 14 and the word lines 16, and interconnects electrically connected with the contacts may be formed in an upper portion of the device.

In the fabrication method for the semiconductor device of this embodiment, an impurity of the first conductivity type is implanted after implantation of a diffusion suppressor in regions between the adjacent word lines. Hence, the impurity of the first conductivity type for isolating the bit lines can be suppressed from diffusing. It is therefore possible to suppress the narrow channel effect while securing the bit line isolation characteristic. As a result, with the narrow channel effect being smaller than in the conventional case, a desired bit line isolation characteristic can be obtained with a cell area smaller than in the conventional case.

Also, with use of nitrogen as the diffusion suppressor, the film quality of edge portions of the ONO films located under the word lines in the gate width direction and the upper oxide films can be improved, and thus the memory cell characteristics can be improved.

Embodiment 2

Figure 6A:
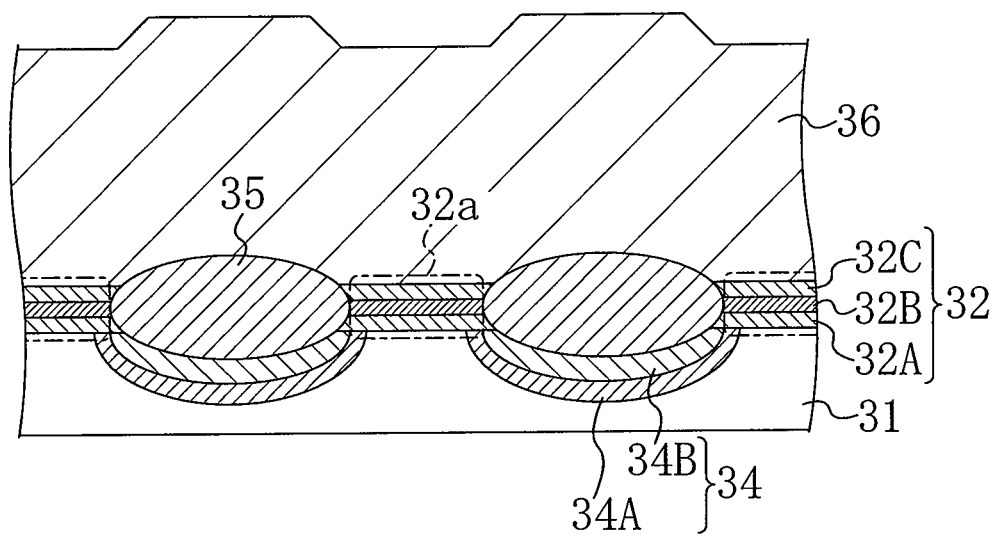
Figure 6B:
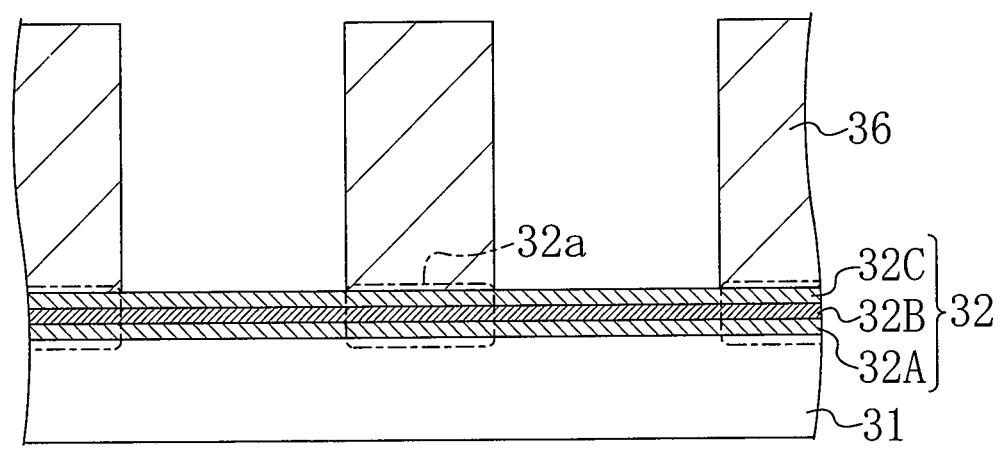
Figure 7A:
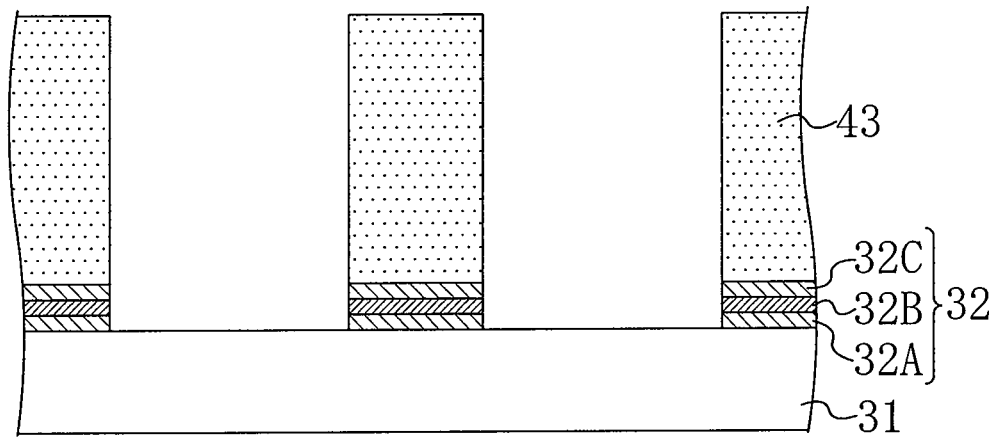
Figure 7B:
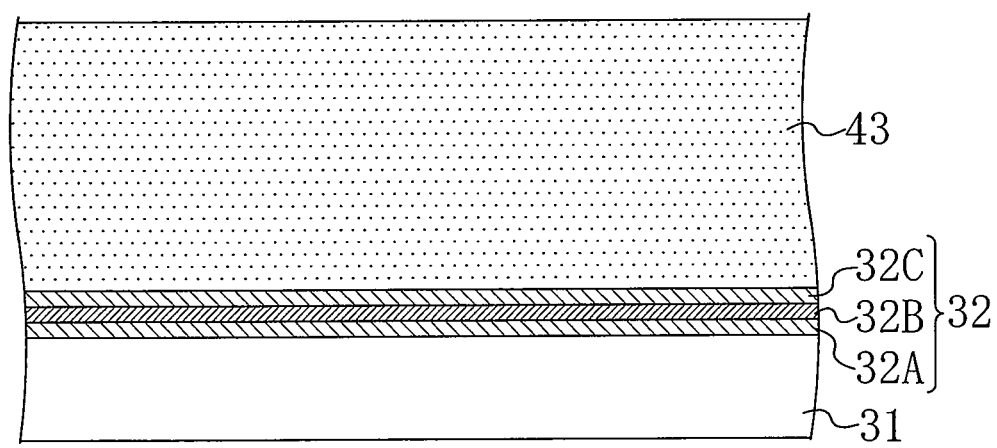

Embodiment 2 will be described with reference to the relevant drawings. FIGS. 6A and 6B show cross-sectional configurations of a semiconductor device of Embodiment 2 in the gate length direction and the gate width direction, respectively.

As shown in FIGS. 6A and 6B, bit lines 34 extending in a first direction are formed in a semiconductor substrate 31 of a first conductivity type. Word lines 36 extending in a second direction intersecting with the first direction are formed on the semiconductor substrate 31. Each bit line 34 is a diffusion layer including an impurity 34A of a second conductivity type and a diffusion suppressor 34B.

First insulating films 32 extending in the first direction are formed on regions of the semiconductor substrate 11 between the adjacent bit lines 34. Each first insulating film 32 is an ONO film having a lower oxide film, a nitride film and an upper oxide film sequentially deposited one upon another. Portions of the first insulating films 32 formed under the word lines 36 serve as gate insulating films 32a.

Bit line overlying insulating films 35 for insulating the bit lines 34 from the word lines 36 are formed on the bit lines 34 in the semiconductor substrate 31.

Hereinafter, a fabrication method for the semiconductor device of this embodiment will be described with reference to the relevant drawings. Note that FIGS. 7A, 8A, 9A and 10A show the section in the gate length direction and FIGS. 7B, 8B, 9B and 10B show the section in the gate width direction. First, as shown FIGS. 7A and 7B, the lower oxide film 32A, the nitride film 32B and the upper oxide film 32C constituting the ONO film are sequentially formed one upon another on the semiconductor substrate 31. A mask pattern 43 is then formed on the ONO film with a photoresist, for example, to selectively remove the ONO film, to thereby form the first insulating films 32 extending in stripes in the first direction.

Figure 8A:
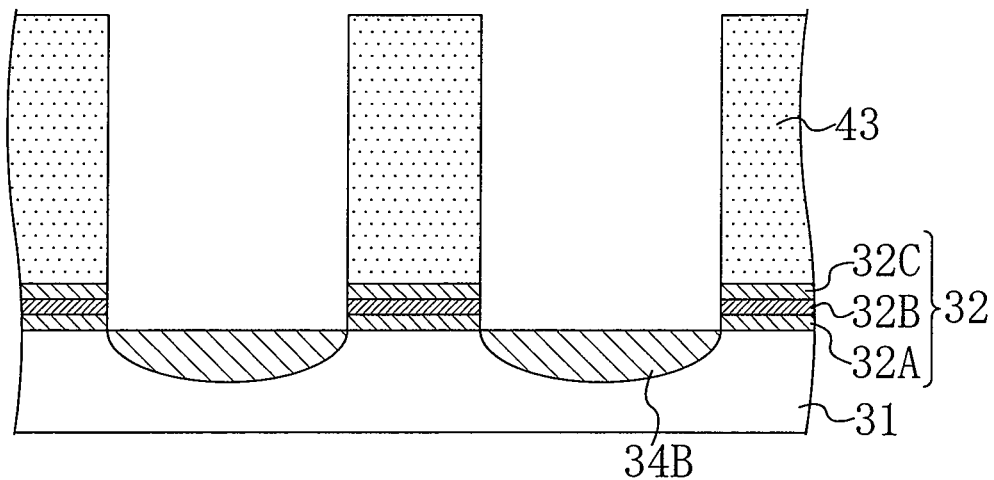
Figure 8B:
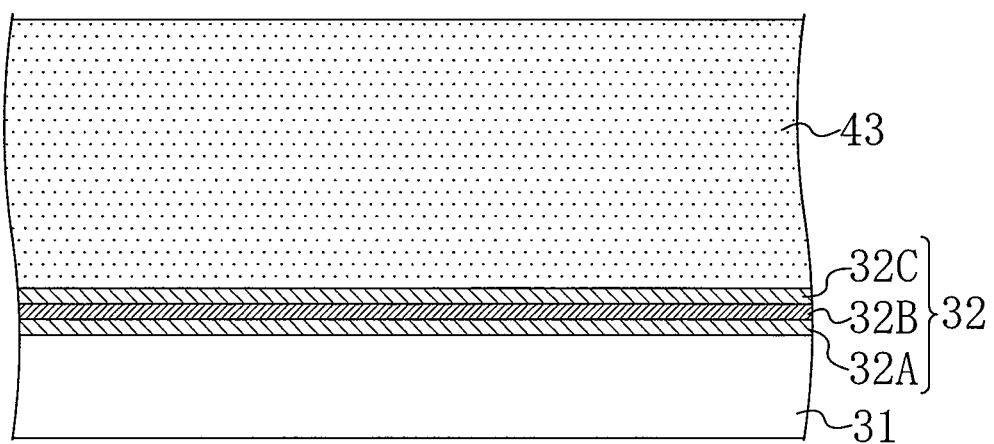

Thereafter, as shown in FIGS. 8A and 8B, the diffusion suppressor 34B is implanted in regions of the semiconductor substrate 31 between the adjacent first insulating films 32. As the diffusion suppressor 34B, any one or a combination of any two or more of nitrogen, fluorine, carbon, indium, germanium and silicon may be used. When nitrogen is used as the diffusion suppressor 34B, the diffusion suppressor 34B is preferably implanted also in the vicinity of the side edges of the first insulating films 32. The dose of the diffusion suppressor 34B may be of the order of $1\times10^{15}/cm^2$ in the case of using nitrogen, for example. The implantation depth (Rp) is preferably made roughly identical to that of the impurity 34A of the second conductivity type to be implanted next. Nitrogen may easily enter the edge portions of the first insulating films 12 by adopting angular implantation with a tilt angle of ion implantation of about 25 degrees.

Figure 9A:
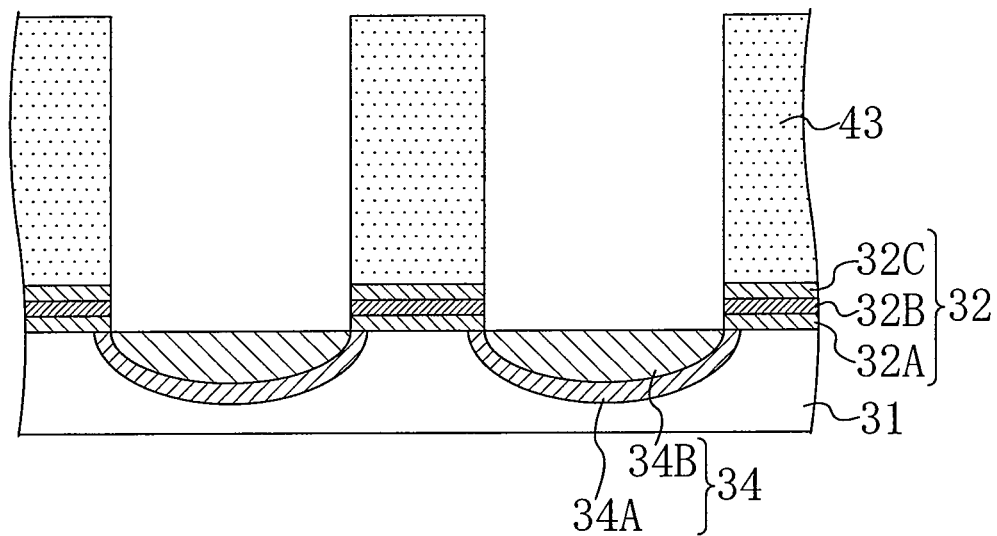
Figure 9B:
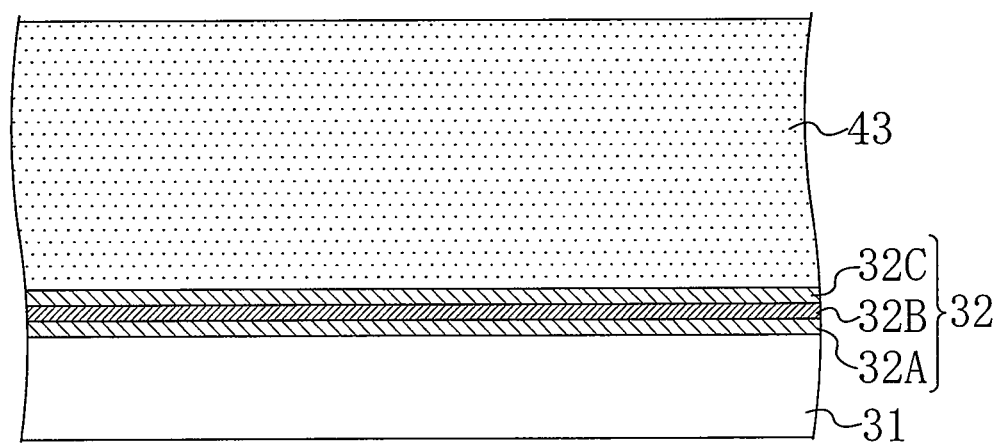

As shown in FIGS. 9A and 9B, the impurity 34A of the second conductivity type is implanted in the regions of the semiconductor substrate 31 between the adjacent first insulating films 32, to thereby form the bit lines 34. As the impurity 34A of the second conductivity type, $As^+$, for example, may be used with a dose of about $2\times10^{15}/cm^2$.

Figure 10A:
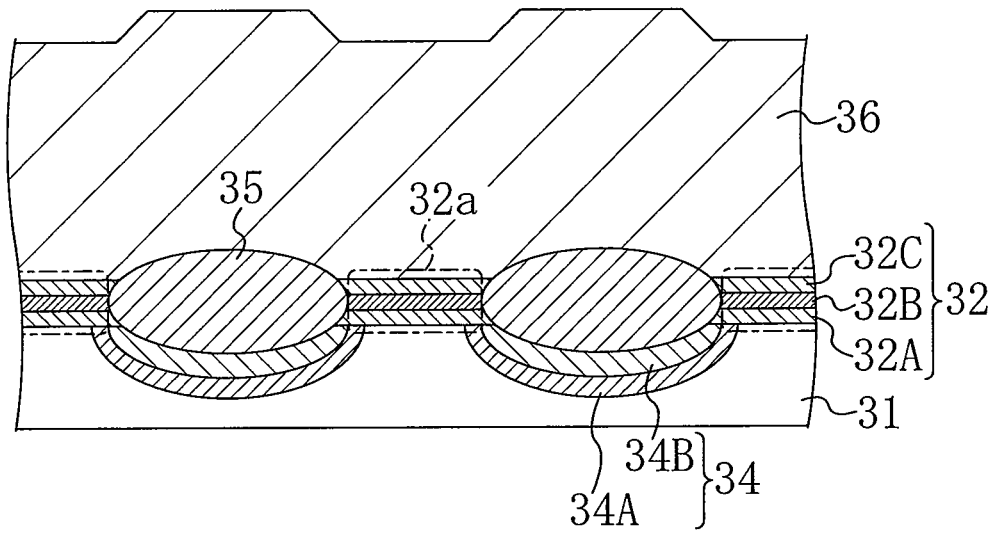
Figure 10B:
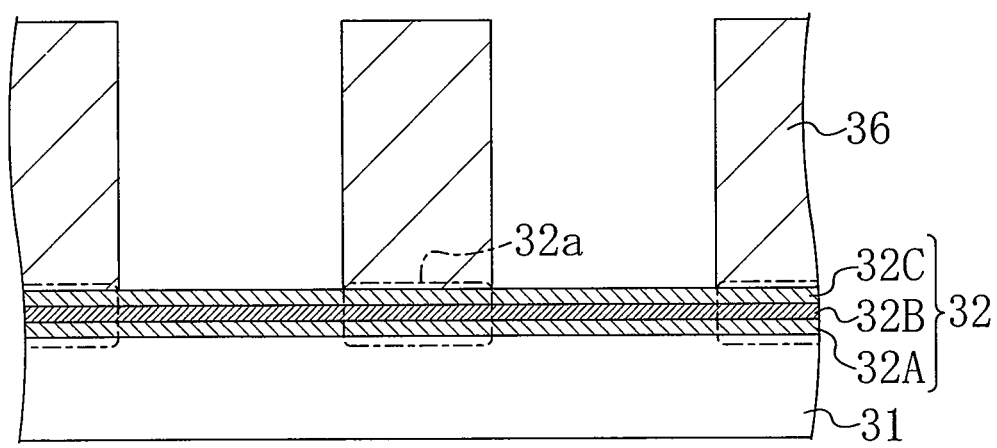

As shown in FIGS. 10A and 10B, after removal of the mask pattern 43, the bit line overlying insulating films 35 are formed on the bit lines 34. Thereafter, a polysilicon film having a thickness of 200 nm, for example, is grown and then implanted with $P^+$ with a dose of about $6\times10^{15}/cm^2$. The polysilicon film is then selectively removed by photolithography using a photoresist mask and dry etching, to thereby form the plurality of word lines 36 extending in a direction orthogonal to the bit lines 34.

Although not illustrated, contacts may be formed in predetermined regions of the bit lines 34 and the word lines 36, and interconnects electrically connected with the contacts may be formed in an upper portion of the device.

In the fabrication method for the semiconductor device of this embodiment, an impurity of the second conductivity type is implanted after implantation of a diffusion suppressor to form bit lines. Hence, the bit lines can be suppressed from diffusing, and thus both reduction in the resistance of the bit lines and suppression of the short channel effect can be easily attained. As a result, with the short channel effect being smaller than in the conventional case, a desired bit line resistance can be obtained with a cell area smaller than in the conventional case.

Also, with use of nitrogen as the diffusion suppressor, the film quality of edge portions of the ONO films located under the word lines in the gate length direction can be improved, and thus the memory cell characteristics can be improved.

Note that bit line isolation diffusion layers for isolating the bit lines as those shown in Embodiment 1 may further be provided.

Embodiment 3

Figure 11A:
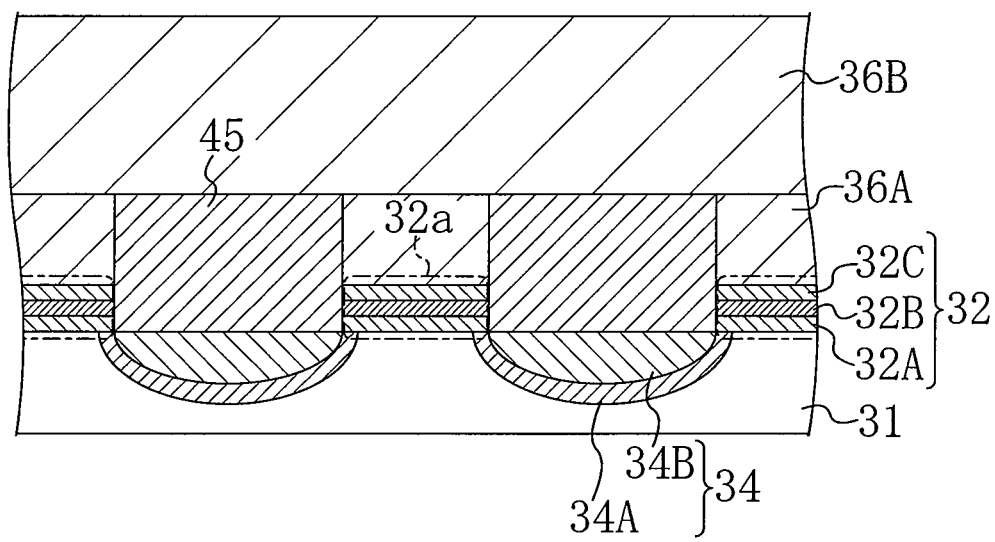
Figure 11B:
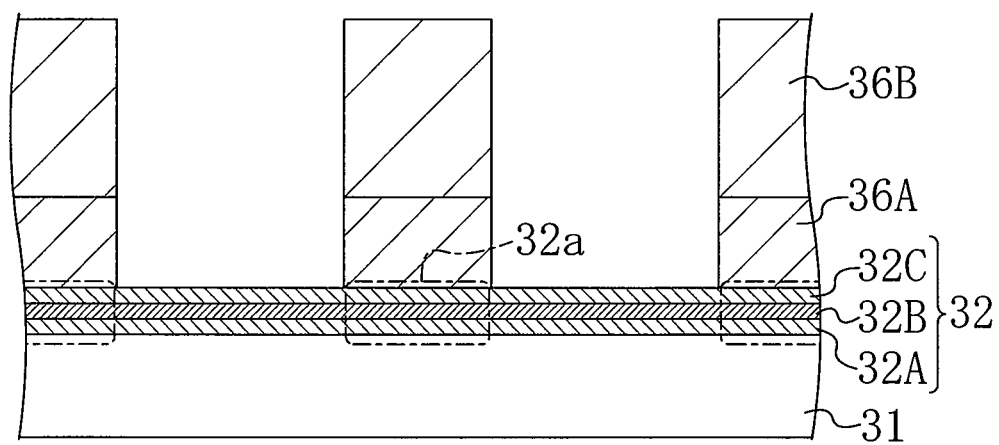
Figure 12A:
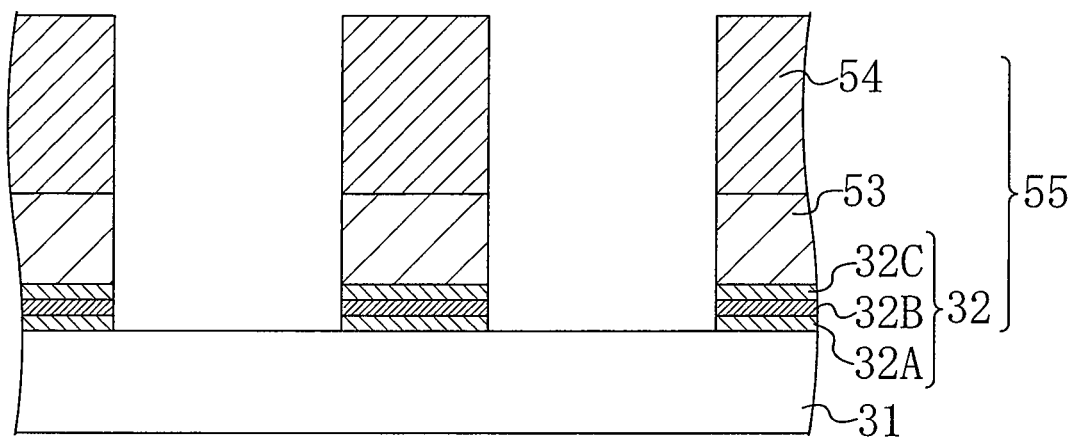
Figure 12B:
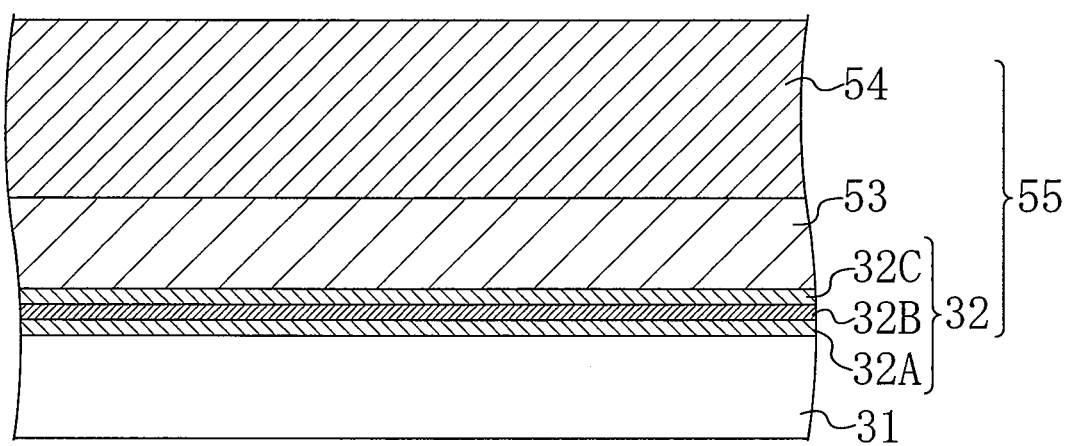

Embodiment 3 of the present invention will be described with reference to the relevant drawings. FIGS. 11A and 11B show cross-sectional configurations of a semiconductor device of Embodiment 3 in the gate length direction and the gate width direction, respectively. In FIGS. 11A and 11B, the same components as those in FIGS. 6A and 6B are denoted by the same reference numerals, and description thereof is omitted here.

In the semiconductor device of Embodiment 3, as shown in FIGS. 11A and 11B, each of word lines 36 is composed of a plurality of lower conductive films 36A formed on gate insulating films 32a and an upper conductive film 36B electrically connecting the plurality of lower conductive films 36A. The top surfaces of the lower conductive films 36A are made flush with the top surfaces of bit line overlying insulating films 45 formed on bit lines.

Hereinafter, a fabrication method for the semiconductor device of this embodiment will be described with reference to the relevant drawings. Note that FIGS. 12A, 13A, 14A and 15A show the section in the gate length direction and FIGS. 12B, 13B, 14B and 15B show the section in the gate width direction. First, as shown FIGS. 12A and 12B, an ONO film having a lower oxide film 32A, a nitride film 32B and an upper oxide film 32C is formed on the semiconductor substrate 31. Subsequently, polysilicon is formed to a thickness of 50 nm and then implanted with $P^+$ ions with a dose of about $1.5\times10^{15}/cm^2$, to form a first conductive film. A silicon nitride film having a thickness of 100 nm is then formed on the first conductive film. The nitride film is then selectively removed by photolithography using a photoresist mask and dry etching, and using the resultant nitride film as a mask pattern, the first conductive film and the ONO film are selectively removed. As a result, stripe-shaped multilayer films 55 each having a first insulating film 32, a lower conductive film formation film 53 and a nitride film 54 formed one upon another are formed.

Figure 13A:
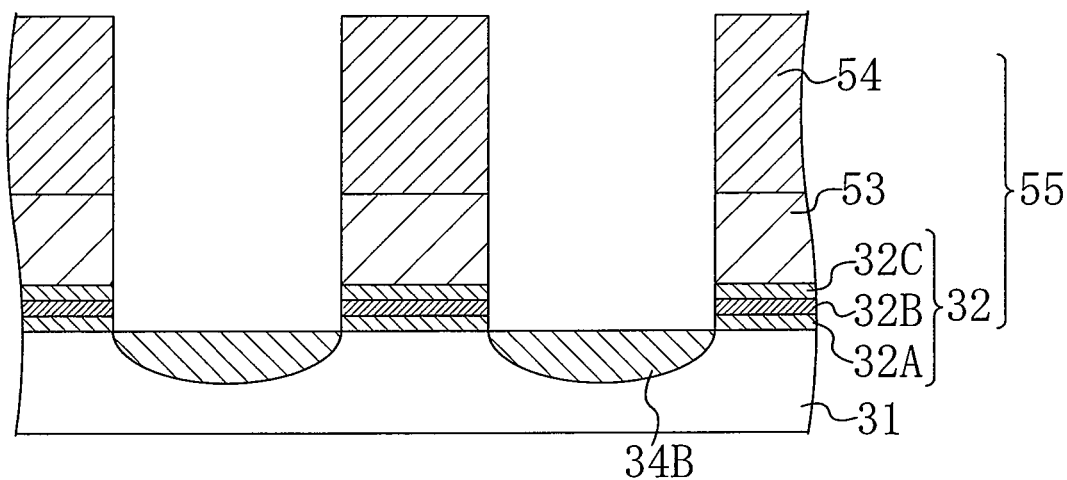
Figure 13B:
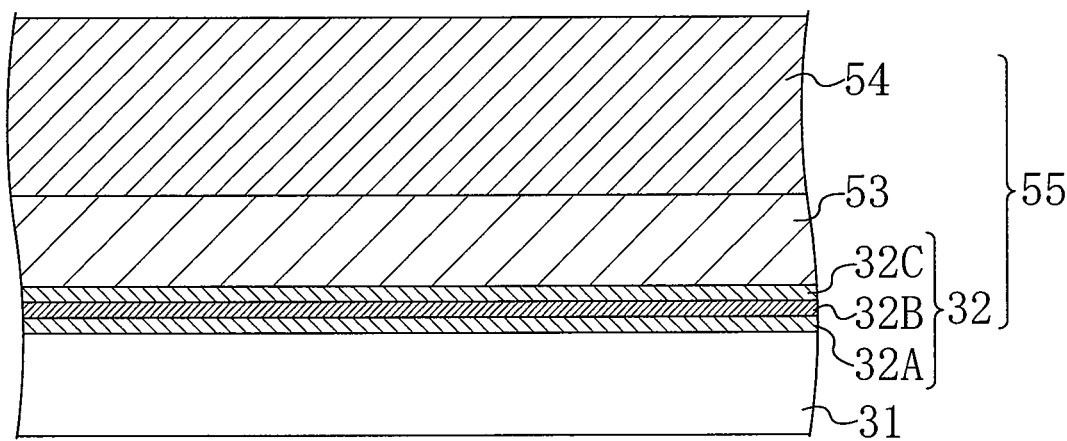

As shown in FIGS. 13A and 13B, a diffusion suppressor 34B is implanted in regions of the semiconductor substrate 31 between the adjacent multilayer films 55. At this time, the diffusion suppressor 34B is also implanted in the nitride films 54 and the underlying lower conductive film formation films 53. As the diffusion suppressor 34B, any one or a combination of any two or more of nitrogen, fluorine, carbon, indium, germanium and silicon may be used. When nitrogen is used as the diffusion suppressor 34B, it is preferred to implant the diffusion suppressor 34B also in the vicinity of the side edges of the first insulating films 32. Also, nitrogen implanted in the lower conductive film formation films 53 may be made to segregate in the vicinity of the upper oxide films constituting the first insulating films 32 under thermal treatment to follow. With such arrangement, the effect of improving the quality of the ONO films can be obtained. The dose of the diffusion suppressor 34B may be of the order of $1\times10^{15}/cm^2$ in the case of using nitrogen, for example. The implantation depth (Rp) is preferably roughly identical to that of an impurity 34A of the second conductivity type to be implanted next. Nitrogen may easily enter the edge portions of the first insulating films 32 by adopting angular implantation with a tilt angle of ion implantation of about 25 degrees.

By adjusting the thickness of the nitride films 54 after the patterning of the first insulating films 32 and the lower conductive film formation films 53 to be about 30 nm, the diffusion suppressor 34B can be directly implanted, not only in the nitride films 54 and the underlying lower conductive film formation films 53, but also in the ONO films. With this arrangement, proper trap characteristics can be imparted especially when nitrogen is used as the diffusion suppressor. When word lines 36 are of a single layer, the thickness of the word lines is so large at the implantation of the diffusion suppressor 34B that the diffusion suppressor 34B fails to reach the ONO film. According to the present invention, however, in which each word line 36 is composed of the lower conductive films 36A and the upper conductive film 36B and the diffusion suppressor is implanted before formation of the upper conductive film 36B, nitrogen can be easily implanted even in the ONO film.

Figure 14A:
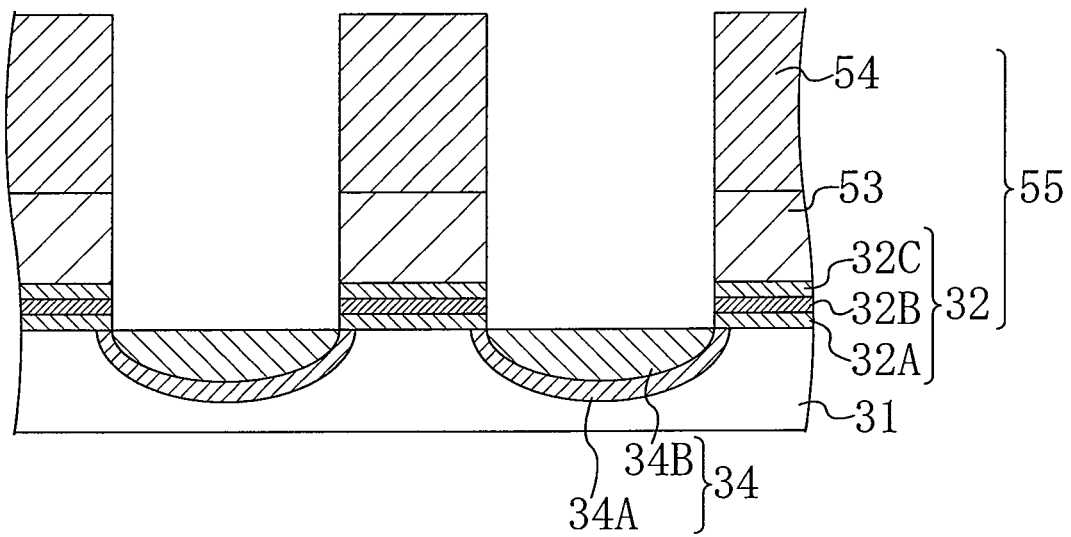
Figure 14B:
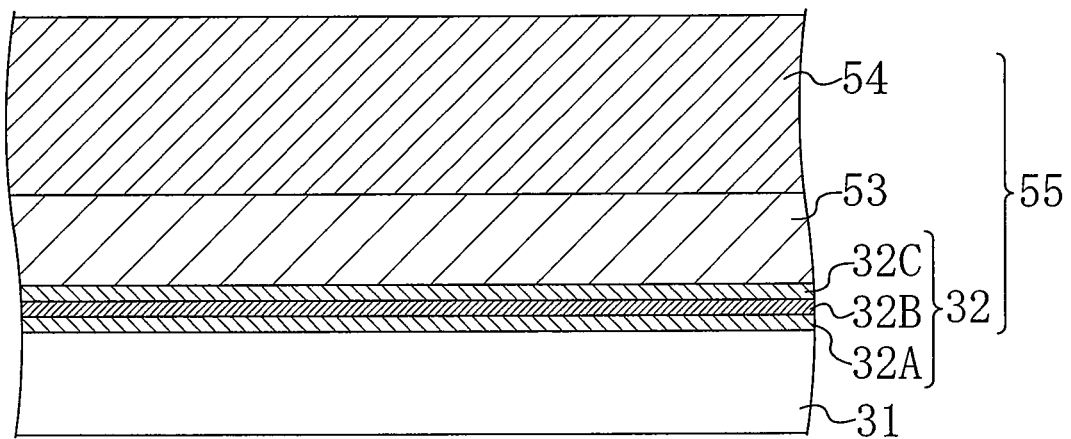

As shown in FIGS. 14A and 14B, the impurity 34A of the second conductivity type is implanted in regions of the semiconductor substrate 31 between the adjacent multilayer films 55, to thereby form the bit lines 34. As the impurity 34A of the second conductivity type, $As^+$, for example, may be used with a dose of about $2\times10^{15}/cm^2$.

Figure 15A:
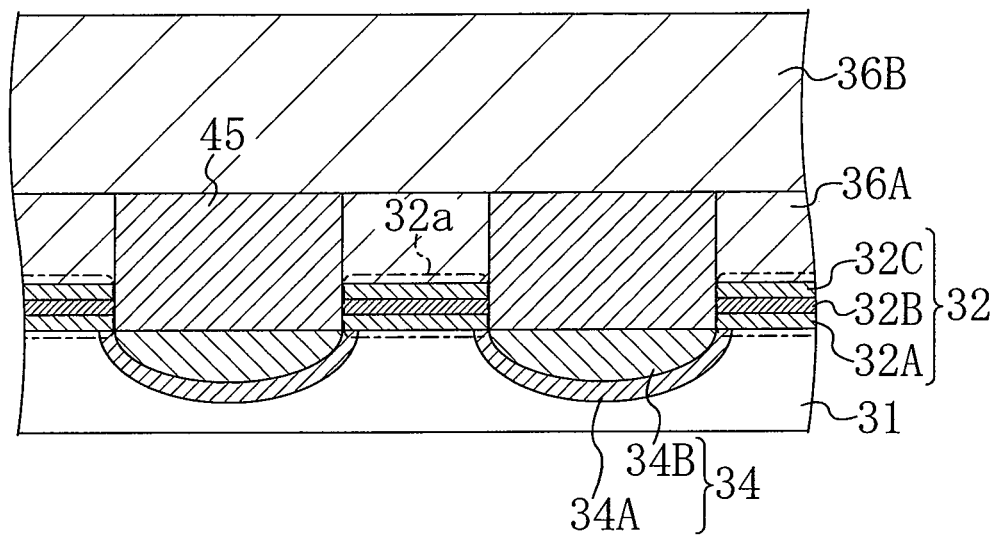
Figure 15B:
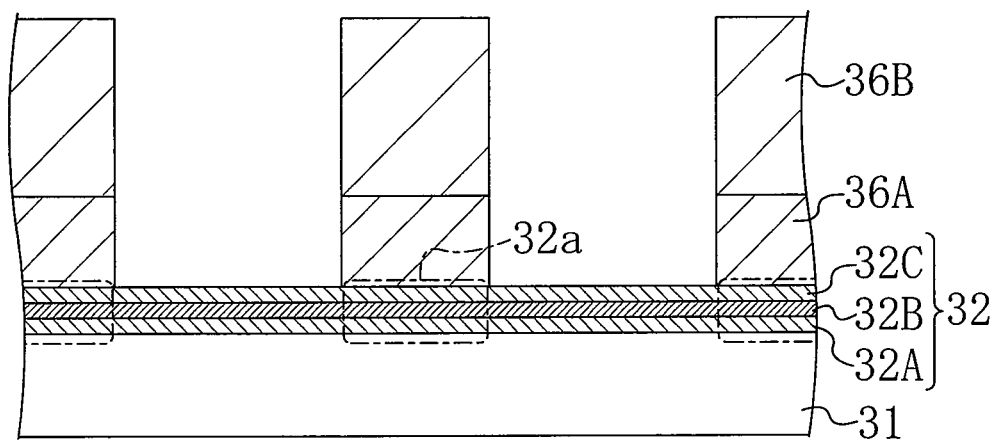

As shown in FIGS. 15A and 15B, a second insulating film is formed on the entire surface of the semiconductor substrate 31 by chemical vapor deposition (CVD) and the like and then flattened by chemical mechanical polishing (CMP) until the lower conductive film formation films 53 are exposed. The remaining nitride films 54 are then removed by wet etching using phosphoric acid, to form the bit line overlying insulating films 45 filling the space between the adjacent multilayer films 55.

Thereafter, a polysilicon film having a thickness of 150 nm is formed on the entire surface of the semiconductor substrate 31 and then implanted with $P^+$ ions with a dose of $4.5\times10^{15}/cm^2$, to thereby form an upper conductive film formation film. The upper conductive film formation film and the lower conductive film formation film are then removed selectively by photolithography using a photoresist mask and dry etching, to thereby form the word lines 36 each having the lower conductive films 36A and the upper conductive film 36B electrically connecting the lower conductive films 36A with one another.

Although not illustrated, contacts may be formed in predetermined regions of the bit lines 34 and the word lines 36, and interconnects electrically connected with the contacts may be formed in an upper portion of the device.

In the fabrication method for the semiconductor device of this embodiment, an impurity of the second conductivity type is implanted after implantation of a diffusion suppressor to form bit lines. Hence, diffusion of the bit lines can be suppressed, and thus both reduction in the resistance of the bit lines and suppression of the short channel effect can be easily attained. As a result, with the short channel effect being smaller than in the conventional case, a desired bit line resistance can be obtained with a cell area smaller than in the conventional case.

Also, with use of nitrogen as the diffusion suppressor, the film quality of the edge portions of the ONO films located under the word lines in the gate length direction can be improved. This can provide the effect of improving the memory cell characteristics.

Note that bit line isolation diffusion layers for isolating the bit lines as those shown in Embodiment 1 may also be provided.

Also, with use of nitrogen as the diffusion suppressor, the film quality of both the edge portions of the ONO films located under the word lines in the gate length direction and the upper oxide films can be improved. This can improve the memory cell characteristics. Moreover, with implantation of the diffusion suppressor in the nitride film of each ONO film, the density of nitrogen can be adjusted. Hence, a further memory cell characteristic improving effect of imparting proper trap characteristics can be obtained.

In Embodiments 1 to 3 described above, the ONO film was exemplified as the gate insulating film. However, the gate insulating film is not limited to the ONO film, but any gate insulating film including a material having the charge hold property (for example, a nitride film, a multilayer film composed of a nitride film and an oxide film, and the like) can be used like the ONO film.

According to the present invention, it is possible implement a semiconductor device in which the impurity profile in regions between adjacent word lines or in bit lines and the like can be controlled properly to permit further miniaturization, and a fabrication method for such a semiconductor device. In particular, the present invention is useful in a semiconductor device having bit lines and word lines orthogonal to the bit lines and a fabrication method for such a semiconductor device.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
    a plurality of bit lines formed in stripes in a semiconductor substrate of a first conductivity type, each of the bit lines being a diffusion layer of an impurity of a second conductivity type;
    a plurality of gate insulation films formed on regions of the semiconductor substrate between the plurality of bit lines;
    a plurality of word lines formed on the semiconductor substrate via the gate insulating films, the word lines extending in a direction intersecting with the plurality of bit lines; and
    a plurality of bit line isolation diffusion layers formed in regions of the semiconductor substrate between the plurality of word lines, each of the bit line isolation diffusion layers being a diffusion layer of an impurity of the first conductivity type and including a first diffusion suppressor for suppressing diffusion of an impurity,
    wherein the first diffusion suppressor is a different element from the impurity of the first conductivity type, and the first diffusion suppressor is formed shallower than the impurity of the first conductivity type.

2. The semiconductor device of claim 1, wherein the first diffusion suppressor is included in regions of the gate insulating films in contact with side edges of the word lines.

3. The semiconductor device of claim 1, wherein each of the gate insulating films is composed of an ONO film having a lower oxide film, a nitride film and an upper oxide film formed one upon another sequentially.

4. The semiconductor device of claim 1, wherein each of the gate insulating films is composed of an ONO film having a lower oxide film, a nitride film and an upper oxide film formed one upon another sequentially, and
the first diffusion suppressor segregates in the upper oxide film.

5. The semiconductor device of claim 1,
wherein each of the bit lines includes a second diffusion suppressor for suppressing diffusion of an impurity.

6. The semiconductor device of claim 5, wherein each of the word lines comprises:
a plurality of lower conductive films formed on the gate insulating films; and
an upper conductive film formed on the plurality of lower conductive films for electrically connecting the plurality of lower conductive films with each other.

7. The semiconductor device of claim 5, wherein the second diffusion suppressor is nitrogen; and
the second diffusion suppressor is included in regions of the gate insulating films adjacent to the bit lines.

8. The semiconductor device of claim 6, wherein each of the gate insulating films is composed of an ONO film having a lower oxide film, a nitride film and an upper oxide film formed one upon another sequentially;
the second diffusion suppressor is nitrogen; and
the nitride film includes the second diffusion suppressor.

9. The semiconductor of claim 8, wherein the second diffusion suppressor segregates in the upper oxide film.

10. The semiconductor device of claim 1, wherein the first diffusion suppressor includes at least one of nitrogen, fluorine, carbon, indium, germanium and silicon.

11. The semiconductor device of claim 5, wherein the second diffusion suppressor includes at least one of nitrogen, fluorine, carbon, indium, germanium and silicon.

* * * * *